US009659784B1

(12) United States Patent
Petterson et al.

(10) Patent No.: US 9,659,784 B1
(45) Date of Patent: May 23, 2017

(54) ION-ASSISTED DEPOSITION AND IMPLANTATION OF PHOTORESIST TO IMPROVE LINE EDGE ROUGHNESS

(71) Applicant: Varian Semiconductor Equipment Associates, Inc., Gloucester, MA (US)

(72) Inventors: Maureen K. Petterson, Salem, MA (US); Tristan Ma, Lexington, MA (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/978,938

(22) Filed: Dec. 22, 2015

(51) Int. Cl.
*H01L 21/425* (2006.01)
*H01L 29/02* (2006.01)
*H01L 21/308* (2006.01)
*H01L 21/027* (2006.01)
*H01L 21/033* (2006.01)

(52) U.S. Cl.
CPC ...... *H01L 21/3086* (2013.01); *H01L 21/0273* (2013.01); *H01L 21/0337* (2013.01)

(58) Field of Classification Search
CPC .................. H01L 21/3086; H01L 21/0337
USPC .................... 257/609–612; 438/525, 531
See application file for complete search history.

(56) References Cited

U.S. PATENT DOCUMENTS

| 4,253,888 | A | * | 3/1981 | Kikuchi | .................. | H01L 21/26 |
| | | | | | | 438/514 |
| 6,533,907 | B2 | * | 3/2003 | Demaray | ................ | C23C 14/34 |
| | | | | | | 204/192.25 |

| 2010/0096566 | A1 | 4/2010 | Bristol et al. |
| 2013/0026607 | A1 | 1/2013 | Moroz et al. |
| 2013/0045591 | A1 | 2/2013 | Shaw et al. |

FOREIGN PATENT DOCUMENTS

| JP | 1994-077183 | * | 4/1992 | .......... | H01L 21/302 |
| KR | 2011-0058659 | A | 6/2011 | | |

OTHER PUBLICATIONS

Tristan Y. Ma, et al., Multiple Exposure Treatment for Processing A Patterning Feature, U.S. Appl. No. 14/645,646, filed Mar. 12, 2015.
ISR and Written Opinion mailed Feb. 20, 2017 in corresponding PCT/US2016/063842.

* cited by examiner

*Primary Examiner* — Calvin Lee

(57) ABSTRACT

Provided herein are approaches for patterning a semiconductor device. Exemplary approaches include providing a set of photoresist patterning features atop a substrate, the set of patterning features having a surface roughness characterized by a set of protrusions and a set of indentations. The approaches further include implanting first ions into a sidewall surface of the set of photoresist patterning features to form a film layer having a non-uniform thickness along the sidewall surface, wherein a thickness of the film layer formed over the indentations is greater than a thickness of the film layer formed over the protrusions. The approaches further include sputtering the sidewall surface of the photoresist patterning features following the formation of the film layer to modify a portion of the film layer and/or the set of protrusions, wherein the sputtering includes directing second ions to photoresist patterning features at an angle with the sidewall surface.

16 Claims, 5 Drawing Sheets

US 9,659,784 B1

ION-ASSISTED DEPOSITION AND IMPLANTATION OF PHOTORESIST TO IMPROVE LINE EDGE ROUGHNESS

FIELD OF THE DISCLOSURE

The present embodiments relate to substrate patterning, and more particularly, to techniques for implanting patterning features with ions to reduce line edge roughness.

BACKGROUND OF THE DISCLOSURE

As critical dimensions of semiconductor devices continue to scale smaller, control over device variation is increasingly important. The geometric variation of fins translates into varied electrical performance across a wafer. Methods to control the line edge roughness (LER) at the photolithography level, especially with EUV resist on smaller feature sizes, is an increasingly high value issue.

Conventional LER reduction of 248 nm styrene-based and 193 nm acrylate-based photoresist may be accomplished using plasma treatment, ion bombardment, and thermal treatments. However, manipulation of the chemical structure of the resist through various plasma chemistries and direct physical sputtering has diminishing returns as the feature size drops below 20 nm. Not only is the photoresist volume far smaller, making modification of the resist difficult without removing a substantial percentage of the material, but the decreased surface area to volume ratio inhibits reflow of the polymer.

Furthermore, the significantly smaller resist volume of such features makes reflow and smoothing of the resist lines more difficult using conventional ion implant processes. Moreover, EUV lithography used for exposing many of the sub-20 nm features suffers from severe shot noise, often resulting in pinched resist lines and high LER. When treating the pinched lines via ion implant, failure of the resist lines as a result of the ion sputtering is common.

SUMMARY OF THE DISCLOSURE

In view of the foregoing, what is needed are methods to improve LER on resist structures incapable of being improved by conventional methods, such as ion bombardment and/or thermal treatments. In one approach, a process for reducing LER includes providing a set of photoresist patterning features atop a substrate, the set of patterning features having a surface roughness characterized by a set of protrusions and a set of indentations. The approaches further include implanting first ions into a sidewall surface of the set of photoresist patterning features to form a film layer having a non-uniform thickness along the sidewall surface, wherein a thickness of the film layer formed over the set of indentations is greater than a thickness of the film layer formed over the set of protrusions. Formation of the film layer acts to (i) repair the pinching, (ii) reduce a certain amount of LER, and (iii) help protect the resist features against ion implant-induced erosion, thus minimizing loss in CD and thickness.

The approaches further include sputtering the sidewall surface of the set of photoresist patterning features following the formation of the film layer to modify a portion of the film layer and/or the set of protrusions, wherein the sputtering includes directing second ions towards the sidewall surface at an angle with the sidewall surface (e.g., parallel or nonparallel) selected to smooth the photoresist. The sputtering may be performed in cases to carefully maintain the CD, or when protrusions need to be trimmed. Furthermore, the ion energy and dose of the second ions can be tailored to the specific deposition type and the magnitude corresponding to the CD to be reduced.

An exemplary method in accordance with the present disclosure may include providing a set of photoresist patterning features atop a substrate, the set of patterning features having a surface roughness characterized by a set of protrusions and a set of indentations, and implanting first ions into a sidewall surface of the set of photoresist patterning features to form a film layer having a non-uniform thickness along the sidewall surface, wherein a thickness of the film layer formed over the set of indentations is greater than a thickness of the film layer formed over the set of protrusions.

Another exemplary method in accordance with the present disclosure may include providing a set of photoresist patterning features atop a substrate, the set of patterning features having a surface roughness characterized by a set of protrusions and a set of indentations, and implanting first ions into a sidewall surface of the set of photoresist patterning features to form a film layer having a non-uniform thickness along the sidewall surface. A thickness of the film layer formed over the set of indentations is greater than a thickness of the film layer formed over the set of protrusions. The method may further include sputtering the sidewall surface of the set of photoresist patterning features following the formation of the film layer to modify a portion of the film layer formed over the set of protrusions, wherein the sputtering includes directing second ions towards the sidewall surface at an angle with the sidewall surface.

An exemplary semiconductor device in accordance with the present disclosure may include a set of photoresist patterning features atop a substrate, the set of patterning features having a surface roughness characterized by a set of protrusions and a set of indentations, and a film layer formed over the set of photoresist patterning features, the film layer having a non-uniform thickness along a sidewall surface of the set of photoresist patterning features, wherein a thickness of the film layer formed over the set of indentations is greater than a thickness of the film layer formed over the set of protrusions.

Figure 1:
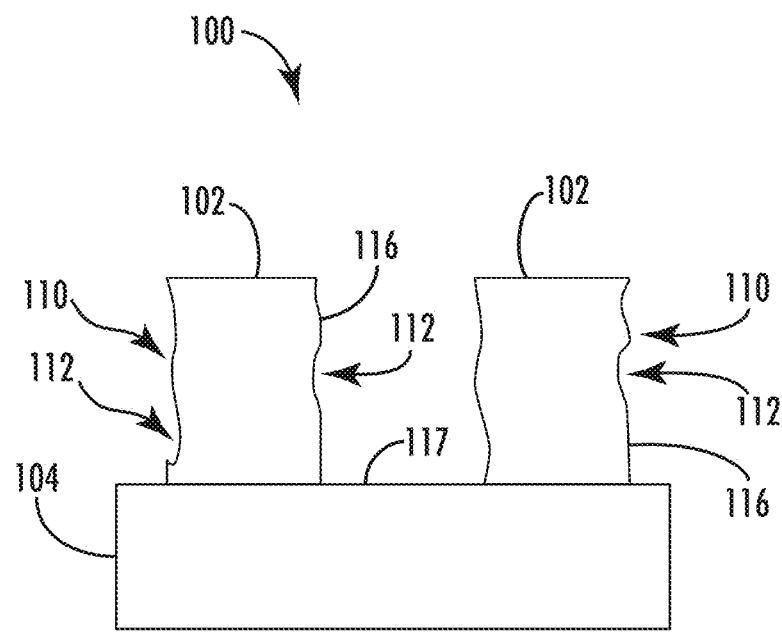
FIG. 1 depicts a side cross-sectional view of an approach for providing a set of patterning features atop a substrate in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, provided herein are approaches for patterning a semiconductor device. In an exemplary approach, an organic or inorganic material is first deposited on a photoresist feature for the purpose of improving LER and minimizing photoresist loss from subsequent processing. This deposition is followed by a sputtering process including energetic ions smoothing the deposited organic or inorganic material, further improving LER and LWR, yet without negatively impacting photoresist feature height or width. Additional processes may be added, when desired, to improve resist profile and pattern etch transfer. Furthermore, although exemplary embodiments herein will address improving LER and LWR, one will appreciate the teachings can apply to any process where smoothing or filling-in small features is needed.

Figure 2:
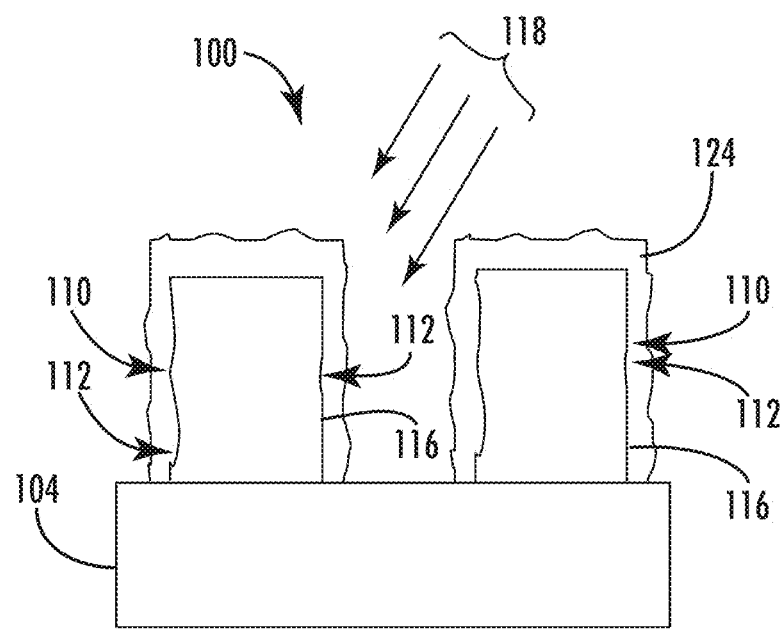
FIG. 2 depicts a side cross-sectional view of an approach for implanting first ions into a sidewall surface of the set of patterning features of FIG. 1 in accordance with an embodiment of the present disclosure.

Turning now to FIGS. 1-2, there is shown cross-sectional views of an approach for patterning a device 100 according to various embodiments of the disclosure. In FIG. 1, a set of patterning features 102 is disposed upon a substrate 104. The set of patterning features 102 may form part of a larger pattern of features disposed on a silicon wafer or other substrate. Accordingly, the set of patterning features 102 may be characteristic of many other similar features disposed on the substrate 104, such as millions of other similar features. In order to transfer an intended shape and size of a feature to the substrate 104 by etching the substrate 104, improvement of the LER/LWR of the set of patterning features 102 while maintaining an acceptable sidewall profile before etching is advantageous.

For example, formation of the set of patterning features 102 may result in non-uniform surface finishes. As shown in FIG. 1, a surface roughness of the set of patterning features 102 may be characterized by a set of protrusions 110 and a set of indentations 112 formed in a sidewall surface 116. In exemplary embodiments, the protrusions 100 and the indentations 112 extend laterally, e.g., along a direction substantially parallel to a surface 117 of the substrate 104. However, embodiments herein are not limited to such.

Next, as shown in FIG. 2, first ions 118 are implanted to the sidewall surface 116 of one or more of the set of patterning features 102 to form a film layer 124 thereon. In exemplary embodiments, the first ions 118 are implanted at an angle nonparallel with the sidewall surface 116, although, in other embodiments, the first ions 118 may be implanted at an angle substantially perpendicular to the surface 117 substrate 104. As shown, the first ions 118 are implanted at approximately 30° incidence angle to the sidewall surface 116 (or approximately 60° relative to a plane normal to the sidewall surface 116) to prevent the formation of nano-scale hardmasks in organic and inorganic materials. The implantation angle may vary by +/−15°. In other embodiments, the first ions 118 may be implanted at an angle substantially perpendicular to the substrate 104. Furthermore, implantation of the first ions 118 works in combination with a subsequent plasma etch process to further improve LER/LWR, as will be described in further detail below.

Figure 3A:
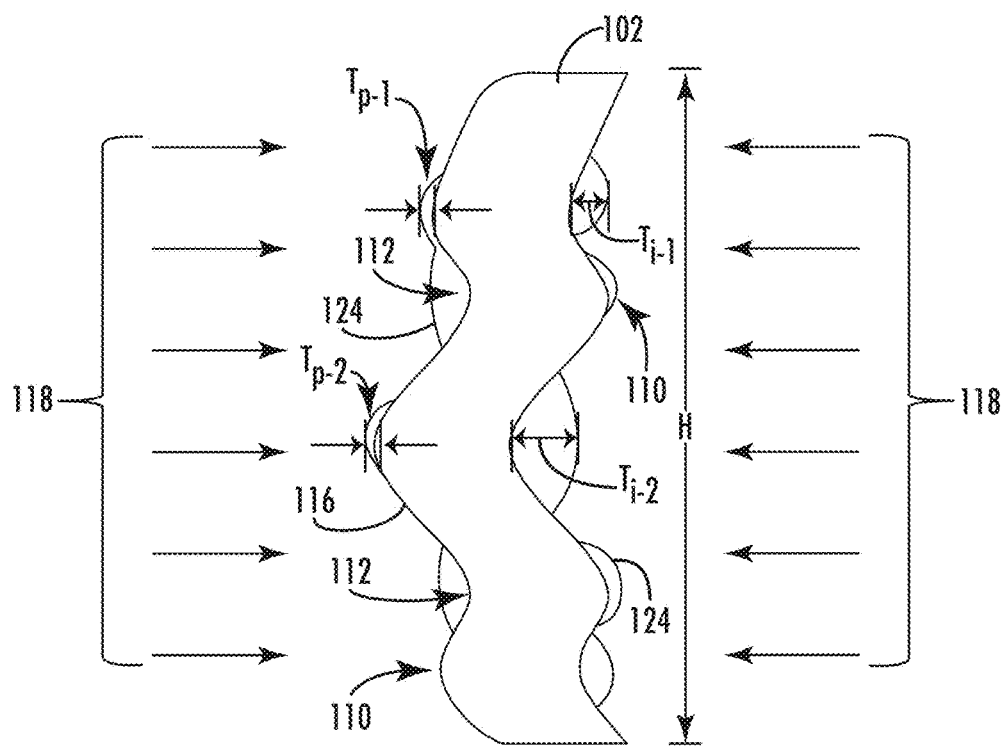
FIGS. 3A-B depict side cross-sectional view of an approach for implanting first ions for forming a film layer along the set of patterning features of FIG. 1 in accordance with embodiments of the present disclosure.
Figure 3B:
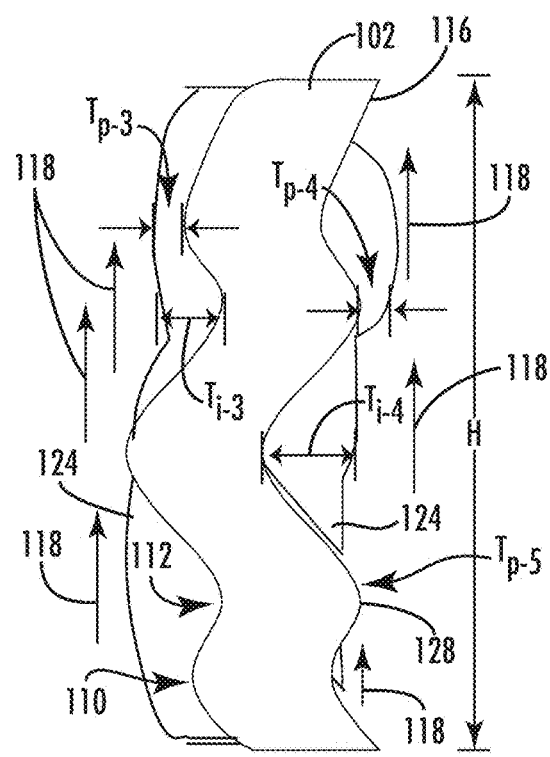

Referring now to FIGS. 3A-B, demonstrating a close-up, exaggerated view of a set of protrusions and indentations formed on a patterning feature, various techniques for implanting the first ions into the sidewall surface will be described in greater detail. The different regimes depicted by FIGS. 3A-B, respectively, have distinctly different mechanisms, although the techniques similarly take advantage of an ability to generate energetic, angled ions within a plasma environment. Furthermore, the regimes are ion-assisted and non-conformal in exemplary embodiments. For example, unlike a conventional film deposition process occurring in RIE and PVD chambers, wherein the film is conformally deposited over surface indentations and protrusions to a uniform thickness, embodiments of the present disclosure provide a non-conformal film deposition so a thickness of the film layer 124 in an area over one or more protrusions 110 of the patterning feature 102 is greater than a thickness of the film layer 124 in an area over one or more indentations 112 of the patterning feature 102.

In exemplary embodiments, the film layer 124 is an organic or inorganic material deposited on the photoresist feature 102, wherein deposition may occur in a plasma enhanced ion source, and may be optimized to deposit primarily on the sidewall surface 116 (although deposition on the top of the feature has no deleterious effects). The specific chemistry and process parameters can be chosen so the deposition occurs either uniformly within a plasma, for example, at an angle and in a direction of the arrows depicting the first ions 118 in FIG. 3A, or at an angle and in a direction of the arrows depicting the first ions 118 in FIG. 3B.

More specifically, in the embodiment shown in FIG. 3A, deposition of the film layer 124 occurs substantially parallel to the implant angle of the first ions 118, whereas in the embodiment shown in FIG. 3B, deposition of the film layer 124 occurs at normal incidence to the implant angle of the first ions 118. In the embodiments shown, the film layer 124 thickness varies along a height 'H' of the patterning feature 102, wherein a thickness Ti of the film layer 124 formed over the indentations 112 is greater than a thickness Tp of the film layer 124 formed over the protrusions 110. As shown, in this non-limiting embodiment, the set of protrusions 110 is interposed with the set of indentations 112 in an alternating pattern.

In the case of FIG. 3A, the first ions 118 catalyze the deposited film layer 124 by providing kinetic energy to reactive species at the photoresist surface. In addition to facilitating deposition, the ion component can impart an additional smoothing benefit contingent upon the angle of incidence. The optimal angle of ion bombardment for enhanced smoothing has been investigated through modeling and/or experiment. For example, a polysilicon surface after bombardment by Ar ions of varying incidence angle between 85° and 45° may result in either vertical or horizontal striations formed within the polysilicon surface, with surface roughness increasing in proportion to the amount of polysilicon etched. However, for 60° of the surface normal, the polysilicon remains relatively smooth.

In the case of FIG. 3B, the deposition is formed primarily by the radicals in the plasma, with deposition being inhibited in areas bombarded by ions. This advantageously forms a deposition of the film layer 124 in the indentations 112 of the set of patterning features 102, thus leading to enhanced smoothing. As shown, a thickness (e.g., $T_{i-3}$ and $T_{i-4}$) of the film layer 124 formed over one or more of the indentations 112 is greater than a thickness (e.g., $T_{p-3}$ and $T_{p-4}$) of the film layer 124 formed over the protrusions 110. In some cases, at least one of the set of protrusions 110 may be devoid of any deposited film layer at a crest 128 thereof, e.g., $T_{p-5}$. The deposition may be accompanied by chemical modification of the patterning features 102 caused by the interaction of the radicals, ions, and VUV photons with the polymer structure. In some embodiments, the chemical modification combined with the deposition of the film layer 124 may eliminate the need for subsequent sputtering.

Deposition of the film layer as shown in FIGS. 3A-B is particularly advantageous for much smaller (e.g. CD<20 nm) and thinner (e.g. <30 nm) resist features, wherein a typical smoothing ion implant would result in an unacceptable amount of resist loss in all directions. The significantly smaller resist volume of such features also makes reflow and smoothing of the resist lines more difficult when relying on typical ion implant processes. Additionally, EUV lithography used for exposing many of the sub-20 nm features suffers from severe shot noise, often resulting in badly pinched resist lines and high LER. Conventionally, breakage of pinched resist lines during ion implantation becomes more likely due to excessive sputtering of the photoresist. Therefore, the embodiments provided herein act to (i) repair the pinching, (ii) reduce LER, and (iii) help protect the resist features against ion implant-induced erosion, thus minimizing loss in CD and thickness.

Furthermore, the selection of the plasma species impacts the deposition process shown in FIGS. 3A-B. Firstly, a plasma species likely to repair and protect the resist using the film layer 124 is selected. Secondly, the selected plasma species may be reactive toward the photoresist, promoting resist ashing or offgasing, thus helping resist reflow and removal of resist protrusion/roughness. In one non-limiting embodiment, examples include $O_2$ and $NH_3$.

In some embodiments, the set of patterning features 102 may suffer from significant footing, or excess material formed at the bottom of the sidewall surface, leading to poor etch results. To remedy this issue, an optional ion implant can be performed before the deposition of the film layer 124. For example, a low dose (e.g. from 5e13 to 5e14) of relatively heavy species, such as Ar, Si, and C, may be implanted at low energy (e.g., 0.5 eV to 2 eV) to slightly densify and stress the surface of the patterning features 102, resulting in straighter sidewall and less footing.

In various embodiments, one or multiple exposure process may be employed to generate the film layer 124 shown in FIGS. 3A-B. In a one-exposure process, the set of patterning features 102 is processed by a first species penetrating the photoresist features to a particular depth or thickness. In a multiple exposure process, the set of patterning features 102 may be processed by a first species in a first exposure at a first angled implant, and may be processed by a second species penetrating the photoresist features to a particular depth or thickness. In various embodiments, the first species may be provided as first ions implanted to a first implantation depth, or deep implantation depth, and the second species may be provided as second ions implanted to a second implantation depth, or shallow implantation depth, less than the first implantation depth. The term "implantation depth," as used herein, may refer to the range Rp of ions within the photoresist, as known in the art.

In particular embodiments, the first ions 118 may be selected from low-mass ions such as hydrogen ions, helium ions, carbon ions, boron ions, or nitrogen ions. Furthermore, the ion implantation energy and ion dose of the first ions 118 may be selected to modify all or a portion of the set of patterning features 102, including generating chain scission within the photoresist feature, generating cross-linking in the photoresist feature, removing hydrogen atoms from the photoresist feature, altering the density of the photoresist feature, or other chemical and/or physical effects.

In particular embodiments, the ions provided in a second exposure may have a higher mass than the first ions. Exemplary second ions include inert gas ions, such as argon; silicon ions, or silicon-containing ions; and carbon. Other examples of second ions include krypton ions, xenon, ions, or germanium ions. The embodiments are not limited in this context. For example, in one embodiment, carbon may be used as first ions implanted at an energy of 20 keV, while carbon is also used as second ions implanted at 1 keV.

In other embodiments, the first ions 118 may constitute vacuum ultraviolet (VUV) radiation where the VUV radiation wavelength is less than 200 nm. The VUV radiation may be configured to penetrate to a depth representing a large fraction of the set of patterning features 102. In other embodiments the first ions may constitute electrons generated, for example, by a plasma also used as a source for ion implantation.

Advantageously, the first ions 118 may homogenize the film layer 124 of the set of patterned features 102 and other underlying layer(s) to eliminate or reduce a chemical and mechanical gradient affecting the resist profile and etching properties. The first ions 118 may also minimize differences in mechanical properties in different portions of the set of patterned features 102 to form the film layer 124 for example, by generating a density gradient between the bulk, or interior portion, and the shell, or outer portion, of the set of patterned features 102.

In various embodiments, the first ions 118 may be provided to the set of patterning features 102 in a beamline ion implanter, a plasma doping tool (PLAD), a plasma tool having a plasma sheath modifier as known in the art, or other tool capable of providing ions. The embodiments of the disclosure are not limited in this context.

Figure 4A:
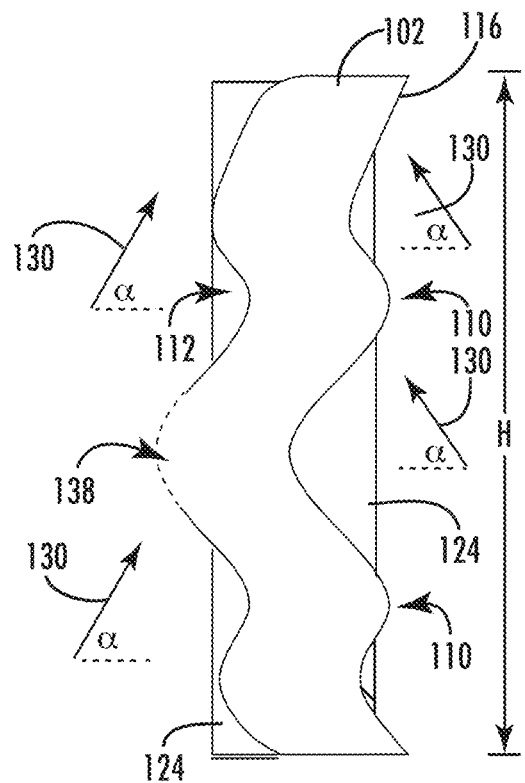
FIGS. 4A-B depict side cross-sectional views of methods for sputtering a set of sidewall features of a semiconductor device in accordance with an embodiment of the present disclosure.
Figure 4B:
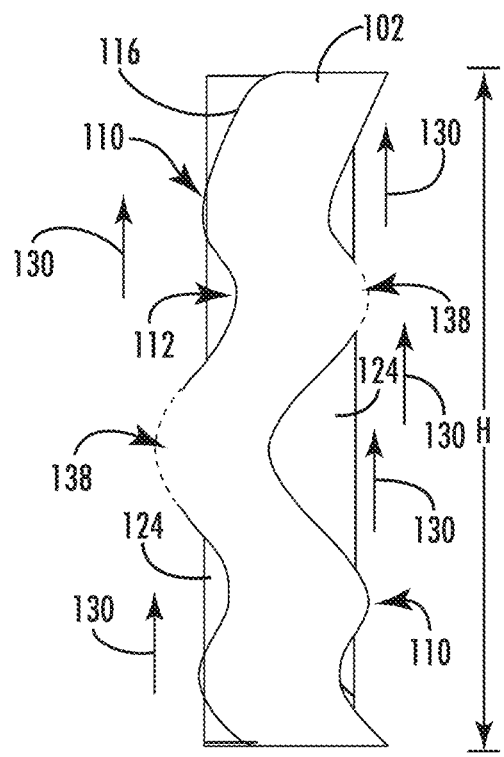

Turning now to FIGS. 4A-B there is shown cross-sectional views of approaches for sputtering the set of patterning features according to various embodiments of the disclosure. As described in greater detail below, FIG. 4A depicts ions used to smooth the film layer 124 via sputtering at a selected angle of incidence, resulting in a photoresist line with decreased roughness, whereas FIG. 4B depicts sputtering with ions oriented substantially parallel to a plane defined by the height 'H' of the patterning feature 102. In the embodiments, the sputtering includes implanting second ions 130 into the sidewall surface 116 of the set of photoresist features 102 following formation of the film layer 124 to modify (e.g., remove or redistribute) a portion 138 of the film layer 124 and/or the set of protrusions 110.

In some embodiments, the sputtering process depicted in FIGS. 4A-B, is performed when the initial deposition of film layer 124 is determined as insufficient to smooth the photoresist, or in the case the film layer 124 increases the critical dimension (CD) of the photoresist lines an unacceptable amount. Therefore, in cases where the CD needs to be carefully maintained or any protrusions need to be trimmed, an energetic ion, such as Ar, may be implanted in a direction optimized to smooth the photoresist. The ion energy and dose can be tailored to the specific deposition type (e.g. higher energy for inorganic deposition) and the magnitude by the CD needs to be trimmed.

In various embodiments, sputtering can be achieved in a number of ways. In a first embodiment, demonstrated by FIG. 4A, the second ions 130 can be implanted incident at a selected angle 'α' (e.g., 60°) optimized for smoothing the protrusions 110 and or the film layer 124. Utilizing the inherent smoothing of angled ion implantation, combined with the preferential sputtering of high regions of deposition, LER may be reduced.

In a second embodiment, demonstrated by FIG. 4B, the second ions 130 may be implanted at an angle substantially parallel to a plane defined by a height 'H' of the patterning feature 102. In this case, the ions primarily sputter deposition fragments of the film layer 124 and portions 138 of the protrusions 110 extending outwardly, with some of the sputtered material falling into adjacent indentations 112, further smoothing the PR line.

Figure 5A:
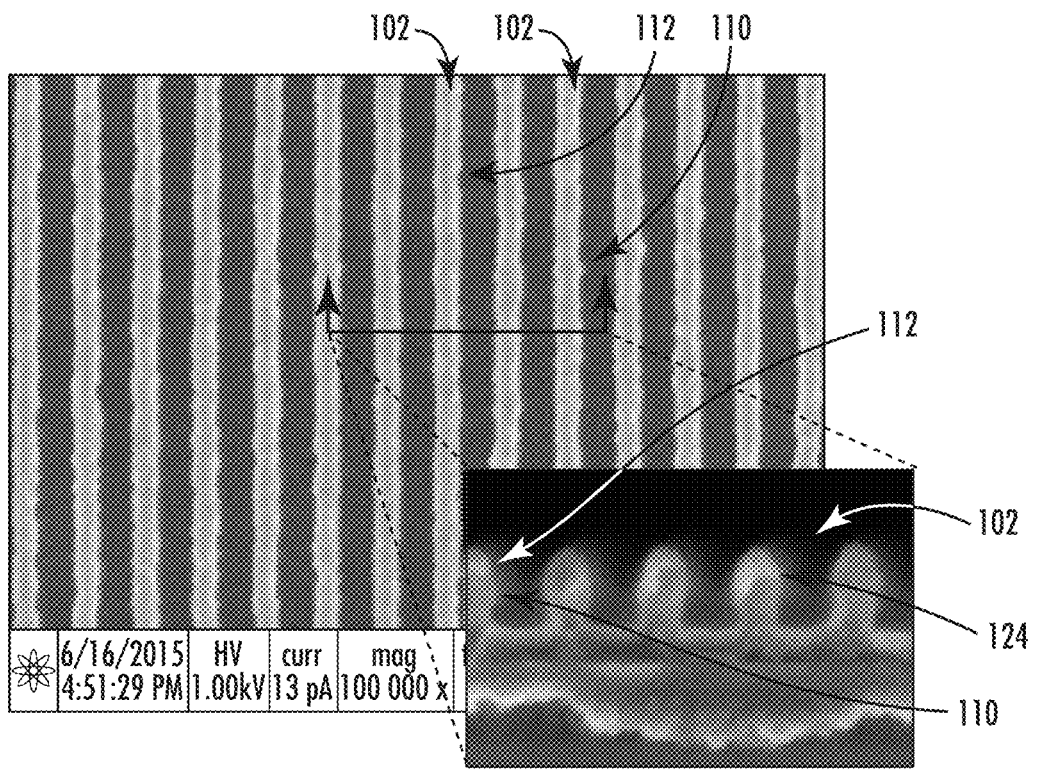
FIG. 5A depicts a top view and cross sectional view (inset) of a semiconductor device during implant of first ions in accordance with an embodiment of the present disclosure.
Figure 5B:
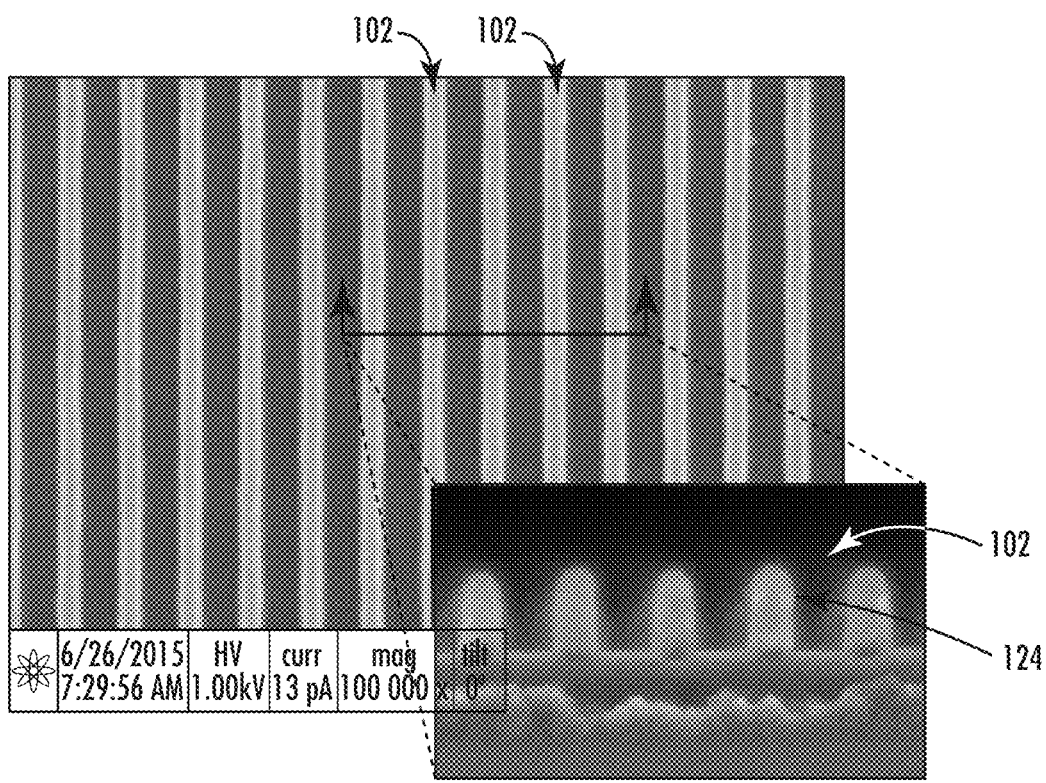
FIG. 5B depicts a top view and cross sectional view (inset) of the semiconductor device of FIG. 5A following implantation of first ions and sputtering in accordance with an embodiment of the present disclosure.

The net transformation resulting from these processes, e.g., directional film deposition and subsequent energetic ion sputter, is demonstrated by FIGS. 5A-B. In this embodiment, a mixture of $CH_3F$ and $O_2$ is used to deposit a polymer based film layer 124 on the set of photoresist patterning features 102, as depicted in the top view and side cross sectional view (inset) depicted in FIG. 5A. Gas flow, gas ratio, implantation energy, and RF power are optimized to create a process similar to the process demonstrated in FIG. 2B, where deposition of the film layer 124 only occurs in regions of the patterning feature 102 where ions are not impacting. After the film layer 124 deposition, Ar ions are used to smooth the film deposition, and possibly the protrusions 110 of the patterning feature 102, resulting in the smoothed set of patterning features 102 shown in the top view and side cross sectional view (inset) depicted in FIG. 5B.

Figure 6:
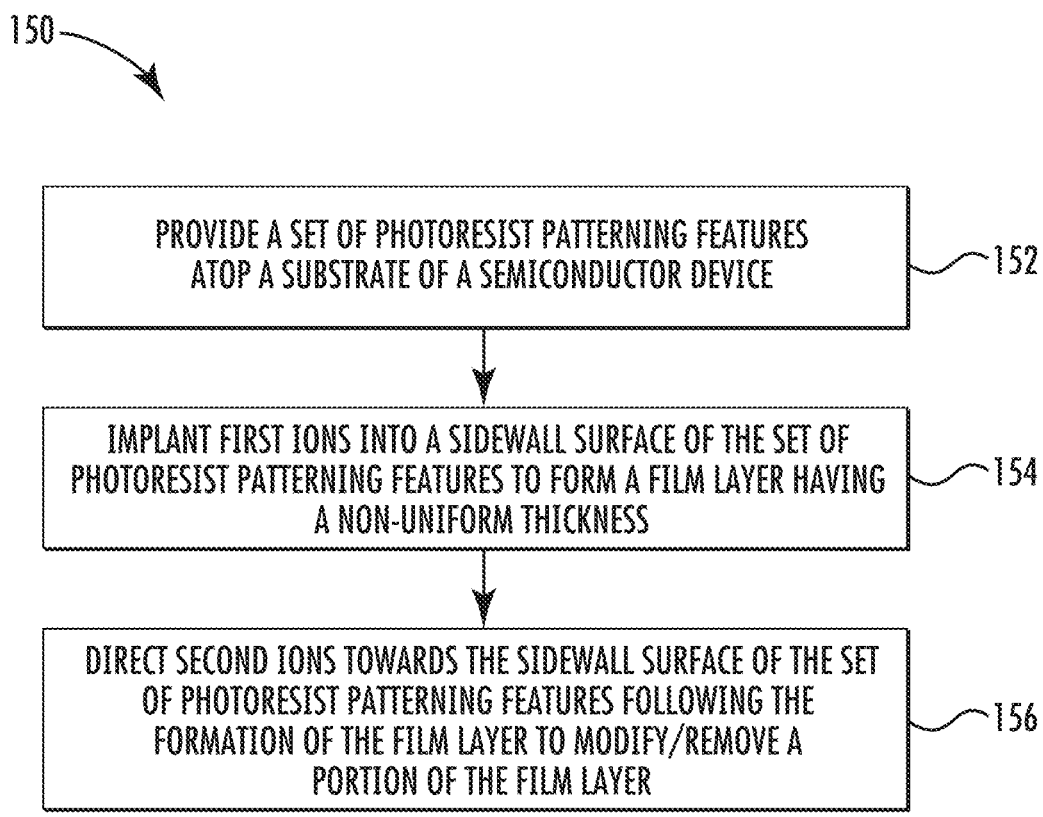
FIG. 6 is a flowchart illustrating an exemplary method according to the present disclosure.

Referring now to FIG. 6, a flow diagram illustrating an exemplary method 150 for patterning a semiconductor device in accordance with the present disclosure is shown. The method 150 will be described in conjunction with the representations shown in FIGS. 1-5.

Method 150 may include providing a set of photoresist patterning features atop a substrate of a semiconductor device, as shown in block 152, wherein the set of patterning features has a surface roughness characterized by a set of protrusions and a set of indentations.

The method 150 may further include implanting first ions into a sidewall surface of the set of photoresist patterning features to form a film layer having a non-uniform thickness, as shown in block 154. In some embodiments, the thickness of the film layer formed over the set of indentations is greater than a thickness of the film layer formed over the set of protrusions. In some embodiments, the first ions are implanted at an angle nonparallel with the sidewall surface. In some embodiments, the first ions are implanted at an angle nonparallel with the sidewall surface, for example, 30 degrees relative to the sidewall surface. In some embodiments, the first ions are implanted at an angle substantially parallel with the sidewall surface. In some embodiments, the first ions comprise one or more of $NH_3$, $CH_3F$ (and similar fluorocarbons) and $O_2$.

The method 150 may further include directing second ions towards the sidewall surface of the set of photoresist patterning features following the formation of the film layer to modify a portion of the film layer, as shown in block 156. In some embodiments, the second ions remove or redistribute a portion of the film layer. In some embodiments, the second ions are directed towards the sidewall to remove a portion of the set of protrusions, further improving LER. In some embodiments, the second ions are implanted at an angle nonparallel with the sidewall surface. In some embodiments, the second ions are implanted at an angle of approximately 60° relative to a plane normal to the sidewall surface. In some embodiments, the second ions are implanted at an angle substantially parallel with the sidewall surface. In some embodiments, the second ions comprise one or more of Ar, Si, or C. In some embodiments, the first ions have a first ion energy, and the second ions have a second ion energy greater than the first ion energy.

In view of the foregoing, at least the following advantages are achieved by the embodiments disclosed herein. Firstly, angling an ion implant directed to a sidewall surface of a patterning feature reduces etch-induced LER originating from sidewall striation. Secondly, etch selectivity with respect to underlying layers disposed under the photoresist is improved, along with photoresist profiles as compared to conventional post-lithography treatments. Thirdly, pinching of recesses due to ion sputtering repair is repaired/minimized. Fourthly, the resist features are protected against ion implant-induced erosion, thus minimizing loss in CD and thickness. Fifthly, in cases where the patterned resist lines have significant footing, an ion implant can be performed to slightly densify and stress the surface of the resist features, resulting in straighter sidewall and less footing.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:
1. A method comprising:
  providing a set of photoresist patterning features atop a substrate, the set of photoresist patterning features having a surface roughness characterized by a set of protrusions and a set of indentations; and implanting first ions into a sidewall surface of the set of photoresist patterning features to form a film layer having a non-uniform thickness along the sidewall surface, wherein a thickness of the film layer formed over the set of indentations is greater than a thickness of the film layer formed over the set of protrusions, and wherein the film layer over the set of protrusions extends farther than the film layer over the set of indentations in a lateral direction substantially parallel to a top surface of the substrate.

2. The method according to claim 1, further comprising implanting second ions into the sidewall surface of the set of photoresist patterning features following formation of the film layer to remove a portion of the set of protrusions.

3. The method according to claim 1, the first ions comprising at least one of $O_2$ and $CH_3F$, and the second ions comprising at least one of Ar, Si, and C.

4. The method according to claim 1, further comprising implanting the first ions at an angle nonparallel with the sidewall surface.

5. The method according to claim 1, further comprising implanting the first ions at an angle substantially parallel with the sidewall surface.

6. The method according to claim 1, further comprising directing second ions towards the sidewall surface of the set of photoresist patterning features following formation of the film layer to modify a portion of the film layer.

7. The method according to claim 6, further comprising implanting the second ions at an angle nonparallel with the sidewall surface.

8. The method according to claim 6, further comprising directing the second ions towards the sidewall surface of the set of photoresist patterning features at an angle substantially parallel with the sidewall surface to redistribute a portion of the film layer.

9. A method for reducing line edge roughness, the method comprising:
    providing a set of photoresist patterning features atop a substrate, the set of patterning features having a surface roughness characterized by a set of protrusions and a set of indentations;
    implanting first ions into a sidewall surface of the set of photoresist patterning features to form a film layer having a non-uniform thickness along the sidewall surface, wherein a thickness of the film layer formed over the set of indentations is greater than a thickness of the film layer formed over the set of protrusions, and wherein the film layer over the set of protrusions extends farther than the film layer over the set of indentations in a lateral direction substantially parallel to a top surface of the substrate; and
    sputtering the sidewall surface of the set of photoresist patterning features following the formation of the film layer to modify a portion of the film layer formed over the set of protrusions, wherein the sputtering includes directing second ions toward the sidewall surface at an angle with the sidewall surface.

10. The method according to claim 9, wherein the second ions are directed toward the sidewall surface at an angle substantially parallel to the sidewall surface to redistribute a portion of the film layer.

11. The method according to claim 9, the first ions comprising at least one of $O_2$ and $CH_3F$, and the second ions comprising at least one of Ar, Si, and C.

12. The method according to 9, the first ions having a first ion energy, and the second ions having a second ion energy greater than the first ion energy.

13. The method according to claim 9, further comprising implanting the first ions at an angle nonparallel with the sidewall surface.

14. The method according to claim 9, further comprising implanting the first ions at an angle substantially parallel with the sidewall surface.

15. The method according to claim 9, further comprising implanting the second ions into the sidewall surface of the set of photoresist patterning features following formation of the film layer to remove a portion of the set of protrusions.

16. The method according to claim 15, further comprising implanting the second ions at an angle of approximately 60° relative to a plane normal to the sidewall surface.

* * * * *